United States Patent
Yoon et al.

(10) Patent No.: US 8,587,005 B2
(45) Date of Patent: Nov. 19, 2013

(54) NITRIDE SEMICONDUCTOR LIGHT EMITTING DEVICE ARRAY

(75) Inventors: Sang Ho Yoon, Gyunggi-do (KR); Kyeong Ik Min, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 119 days.

(21) Appl. No.: 13/093,469

(22) Filed: Apr. 25, 2011

(65) Prior Publication Data

US 2011/0198625 A1    Aug. 18, 2011

Related U.S. Application Data

(62) Division of application No. 11/819,785, filed on Jun. 29, 2007, now abandoned.

(30) Foreign Application Priority Data

Jun. 30, 2006    (KR) .................. 10-2006-0060699

(51) Int. Cl.
  *H01L 33/20*    (2010.01)
(52) U.S. Cl.
  USPC .. 257/95; 257/13; 257/E33.001; 257/E27.119
(58) Field of Classification Search
  USPC ............... 257/79, E51.018, E51.019, E51.02, 257/E51.021, E33.001, E33.007, 13, 82, 257/E27.119, E27.12, E21.527, 94–103; 438/22, 29, 46
  See application file for complete search history.

(56) References Cited

U.S. PATENT DOCUMENTS

| | | | |
|---|---|---|---|
| 5,958,794 A * | 9/1999 | Bruxvoort et al. | 438/692 |
| 6,693,021 B1 * | 2/2004 | Motoki et al. | 438/481 |
| 6,924,500 B2 | 8/2005 | Okuyama et al. | |
| 7,511,311 B2 * | 3/2009 | Kususe et al. | 257/95 |

(Continued)

FOREIGN PATENT DOCUMENTS

| | | |
|---|---|---|
| JP | 11-238687 | 8/1999 |
| JP | 2002-100805 | 4/2002 |

(Continued)

OTHER PUBLICATIONS

Japanese Office Action, with English Translation, issued in Japanese Patent Application No. 2007-172598, dated Jan. 4, 2011.

(Continued)

*Primary Examiner* — Cuong Q Nguyen
*Assistant Examiner* — Yosef Gebreyesus
(74) *Attorney, Agent, or Firm* — McDermott Will & Emery LLP

(57)    ABSTRACT

A nitride semiconductor light emitting device array, which includes a dielectric layer formed on a first conductivity lower nitride semiconductor layer, having a plurality of windows. Each of a plurality of hexagonal pyramid light emission structures is grown from a surface of the first conductivity lower nitride semiconductor layer exposed through each of the windows and onto a peripheral area of the window of the dielectric layer. Each of the hexagonal pyramid light emission structures includes a first conductivity upper nitride semiconductor layer, an active layer and a second conductivity nitride semiconductor layer formed in their order. The windows are disposed in such a triangular arrangement that side surfaces of the adjacent hexagonal pyramid light emission structures face each other. Also, a distance between bases of the adjacent hexagonal pyramid light emission structures is less than 0.3 times an interval between centers of the windows of the adjacent hexagonal pyramid light emission structures.

7 Claims, 7 Drawing Sheets

(56) References Cited

U.S. PATENT DOCUMENTS

| | | |
|---|---|---|
| 2002/0117677 A1 | 8/2002 | Okuyama et al. |
| 2003/0107047 A1 | 6/2003 | Okuyama et al. |
| 2004/0089222 A1 | 5/2004 | Motoki et al. |
| 2005/0045894 A1* | 3/2005 | Okuyama et al. ............... 257/95 |
| 2005/0145859 A1* | 7/2005 | Okuyama et al. ............... 257/81 |
| 2005/0170538 A1* | 8/2005 | Okuyama et al. ............... 438/22 |
| 2005/0174023 A1* | 8/2005 | Nakajima et al. ............... 313/30 |
| 2005/0253158 A1 | 11/2005 | Yasukawa et al. |
| 2005/0285136 A1 | 12/2005 | Ou et al. |
| 2006/0258027 A1* | 11/2006 | Ohmae et al. ................... 438/22 |
| 2007/0085102 A1* | 4/2007 | Orita .............................. 257/98 |
| 2007/0108459 A1* | 5/2007 | Lu .................................. 257/98 |
| 2008/0006831 A1* | 1/2008 | Ng ................................. 257/79 |
| 2008/0014723 A1* | 1/2008 | Shibata .......................... 438/478 |
| 2008/0054278 A9* | 3/2008 | Ou et al. ........................ 257/95 |

FOREIGN PATENT DOCUMENTS

| | | |
|---|---|---|
| JP | 2002-246649 | 8/2002 |
| JP | 2005-277374 | 10/2005 |
| JP | 2006-013500 | 1/2006 |
| WO | WO 2006/035212 A1 | 4/2006 |

OTHER PUBLICATIONS

Japanese Office Action, with English Translation, issued in Japanese Patent Application No. 2007-172598, dated Aug. 16, 2011.

* cited by examiner

NITRIDE SEMICONDUCTOR LIGHT EMITTING DEVICE ARRAY

CROSS-REFERENCE TO RELATED APPLICATIONS

This application is a Divisional of U.S. application Ser. No. 11/819,785, filed on Jun. 29, 2007, now abandoned which claims the benefit of Korean Patent Application No. 2006-0060699 filed on Jun. 30, 2006, in the Korean Intellectual Property Office, the disclosures of which are incorporated herein by reference.

BACKGROUND OF THE INVENTION

1. Field of the Invention

The present invention relates to a light emitting device array and, more particularly, to a light emitting device array having a plurality of hexagonal pyramid light emitting structures formed by selective growth.

2. Description of the Related Art

Recently, researches have been actively conducted on semiconductor light emitting devices as a new light source that can replace filament-based light bulbs and fluorescent lamps. In particular, the researches on light emitting diodes (LEDs) using nitride compound semiconductors such as GaN have been gaining attention. Without a suitably compatible substrate, however, nitride crystals tend to have many crystal defects.

To remedy such problems, there has been suggested a method providing a high quality nitride light emitting device by forming hexagonal pyramid-shaped light emitting structures by selective growth.

FIG. 1 is a sectional view illustrating a conventional hexagonal pyramid shaped light emitting device.

As shown in FIG. 1, a dielectric layer 14 having a window W is formed on a first conductivity lower nitride semiconductor layer 12a formed on a sapphire substrate 11. A first conductivity upper nitride semiconductor layer 12b, an active layer 15, and a second conductivity nitride semiconductor layer 16 are grown in the window W by a lateral growth process utilizing the dielectric layer 14. At this time, the nitride semiconductor layers 12b, 15 and 16 are grown in the window W to form a hexagonal pyramid shaped light emitting structure. One of a transparent conductive thin film 17 and an electrode 19 is fanned on the second conductivity nitride semiconductor layer 16 of the hexagonal pyramid light emitting structure, and a part of the dielectric layer is etched to expose a surface of the first conductivity lower nitride semiconductor layer 12a and form another electrode 18 of different polarity.

It has been reported that a large number of defects, growing in a horizontal direction, in the nitride single crystals obtained by the selective growth, are blocked or change direction in the process of lateral growth, thus rarely affecting the active layer. Also, since the effect of lattice mismatch between the nitride single crystals and a substrate is insignificant, the crystal growth defects may be decreased.

In such an LED structure, a hexagonal pyramid structure has a substantial light emission area enlarged by the inclined side surfaces thereof and the piezoelectric field effect may also be mitigated by the crystal growth direction.

In addition, in order to obtain superior luminance, the hexagonal pyramid light emission structure shown in FIG. 1 is provided in a plurality arranged in an array. For optimal space utilization, the windows of the hexagonal pyramid light emitting devices are disposed in a triangular arrangement.

However, as shown in FIG. 2, in an equilateral triangular arrangement of windows, even if the hexagonal pyramid light emission structures 20 are grown to occupy a maximum area, a great number of wasted areas A, which cannot be utilized as the light emission area, remain.

Therefore, there is a need for an arrangement of hexagonal pyramid light emission structures in order to minimize the waste of space and maximize the light emission area of a light emitting device.

SUMMARY OF THE INVENTION

An aspect of the present invention provides a nitride semiconductor light emitting device array, which maximizes a light emission area formed by a plurality of hexagonal pyramid light emission structures by improving an arrangement of the hexagonal pyramid light emission structures and windows.

According to an aspect of the invention, there is provided a nitride semiconductor light emitting device array including: a dielectric layer formed on a first conductivity lower nitride semiconductor layer and having a plurality of windows formed therethrough; and a plurality of hexagonal pyramid light emission structures each selectively grown from a surface of the first conductivity lower nitride semiconductor layer exposed through each of the windows and onto a peripheral area of the window of the dielectric layer, each of the hexagonal pyramid light emission structures comprising a first conductivity upper nitride semiconductor layer, an active layer and a second conductivity nitride semiconductor layer formed in their order, wherein the plurality of windows are disposed in a triangular arrangement such that side surfaces of one of the hexagonal pyramid light emission structures face side surfaces other adjacent ones of the hexagonal pyramid light emission structures, and wherein a distance from a base of one of the hexagonal pyramid light emission structures to a base of another adjacent one of the hexagonal pyramid light emission structures is less than 0.3 times an interval from a center of the window of one of the hexagonal pyramid light emission structures to a center of the window of another adjacent one of the hexagonal pyramid light emission structures.

The side surface of each of the hexagonal pyramid light emission structure may be in [11-20] direction. Also, a sum of side surface areas of the plurality of hexagonal pyramid light emission structures may be greater than a total growth surface area of the dielectric layer.

To obtain a substantially maximum light emission area under an optimal arrangement condition, adjacent ones of the hexagonal pyramid light emission structures may be arranged to abut each other at bases thereof.

In the exemplary embodiments of the present invention, a horizontal structure as well as a vertical structure light emitting device may be realized in terms of electrode arrangement.

A horizontal-structure nitride semiconductor light emitting device array according to an embodiment further includes a substrate having the first conductivity lower nitride semiconductor layer formed thereon; a first electrode formed on a surface of the first conductivity lower nitride semiconductor layer; a light-transmitting conductive layer formed on the second conductivity nitride semiconductor layer; and a second electrode formed on a surface of the light transmitting conductive layer. In this case, the substrate may be one selected from the group consisting of a sapphire substrate, a SiC substrate and a Si substrate.

A vertical-structure nitride semiconductor light emitting device array according to another embodiment may further include a light-transmitting conductive layer with the first conductivity lower nitride semiconductor layer formed thereon; a first electrode formed on a surface of the light-transmitting conductive layer; a reflective electrode layer formed on the second conductivity nitride semiconductor layer; and a conductive support structure formed on the reflective electrode layer to function as a second electrode. In particular, in the vertical structure light emitting device array according to the present invention, since reflecting layers are formed on the upper surfaces of the hexagonal pyramid light emitting structure, light is focused and extracted through the first conductivity lower nitride semiconductor layer, thereby significantly improving the light extraction efficiency.

According to another aspect of the invention, there is provided a nitride semiconductor light emitting device array including: a dielectric layer formed on a first conductivity lower nitride semiconductor layer and having a plurality of windows formed therethrough at a predetermined interval in rows and columns in a rectangular arrangement; and a plurality of hexagonal pyramid light emission structures each selectively grown from a surface of the first conductivity lower nitride semiconductor layer exposed by each of the windows and onto a peripheral portion of each of the windows of the dielectric layer, each of the hexagonal pyramid light emission structure comprising a first conductivity upper nitride semiconductor layer, an active layer and a second conductivity nitride semiconductor layer formed in their order, wherein one of the hexagonal pyramid light emission structures has at least one base abutting at least one base of at least one other adjacent hexagonal pyramid light emission structure disposed in one direction of rows and columns, and has at least one edge facing at least one edge of other adjacent ones of the hexagonal pyramid light emitting structures disposed in the other direction of rows and columns.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 3:
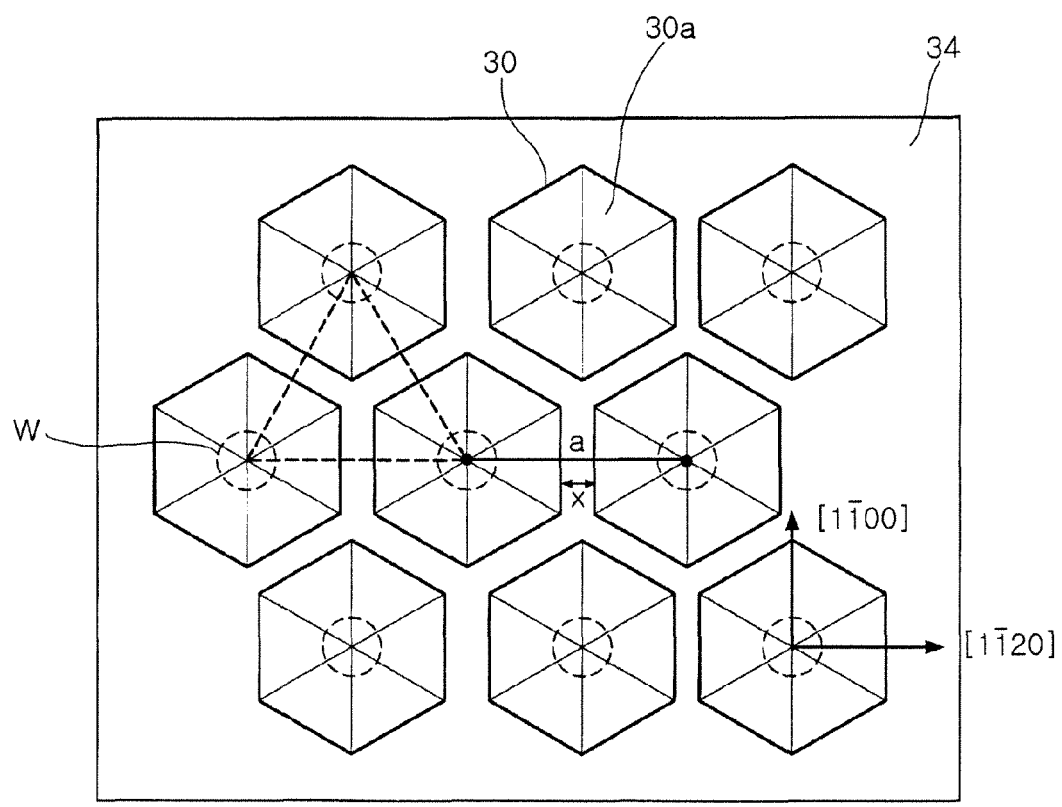
FIG. 3 is a schematic plan view illustrating a hexagonal pyramid nitride light emitting device array according to an embodiment of the present invention.

FIG. 3 is a schematic plan view illustrating a hexagonal pyramid nitride light emitting device array according to an embodiment of the present invention.

Figure 1:
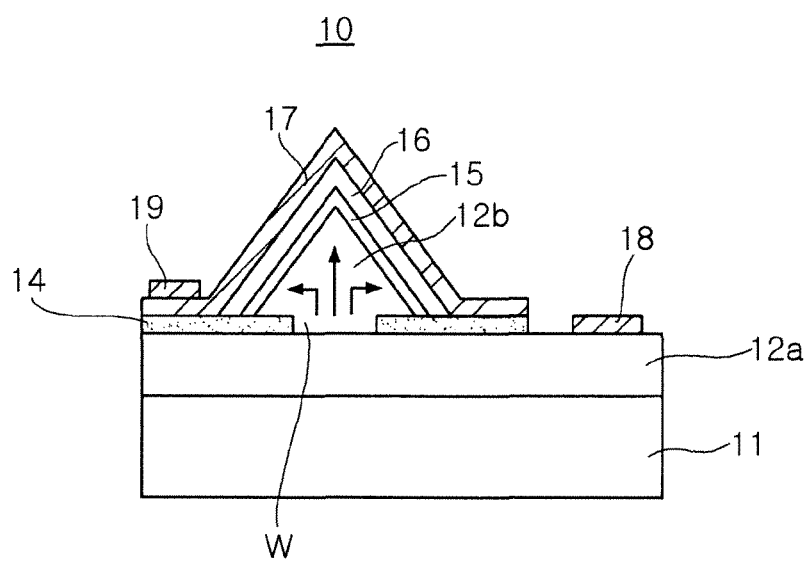
FIG. 1 is a sectional view illustrating a conventional hexagonal pyramid nitride light emitting device.
Figure 2:
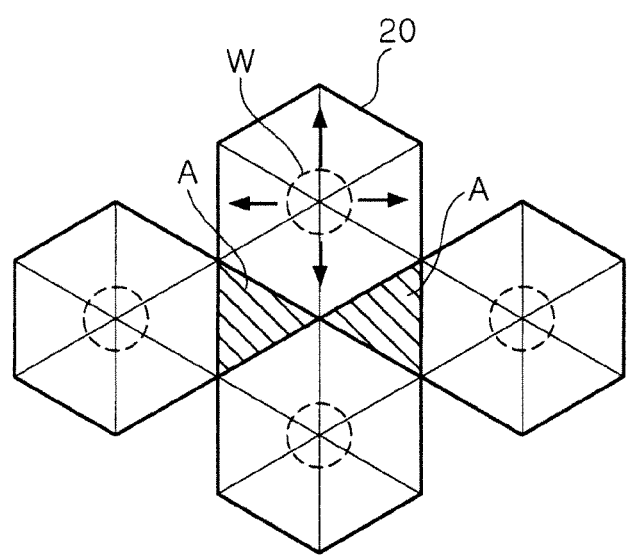
FIG. 2 is a schematic view illustrating a conventional hexagonal pyramid nitride light emitting device array.

FIG. 3 illustrates a light emitting device array with hexagonal pyramid nitride light emission structures 30 grown on a dielectric layer 34 with a plurality of windows W formed therethrough. As described herein with reference to FIG. 1, each of the hexagonal pyramid nitride light emission structure 30 may be understood as including a first conductivity upper nitride semiconductor layer, an active layer and a second conductivity nitride semiconductor layer selectively grown in the window W.

For an optimal arrangement of the hexagonal pyramid nitride light emission structures 30 according to the present invention, the plurality of windows W are disposed in an equilateral triangular arrangement, which is regularly repeated. In particular, the windows W are arranged in such away that side surfaces 30a of the adjacent hexagonal pyramid light emission structures 30 face each other. Such an arrangement in which the side surfaces 30a of the adjacent hexagonal pyramid light emission structures 30 face each other may be obtained by suitably adjusting the locations of the windows in the equilateral triangular arrangement in consideration of the crystal direction. The windows W may be suitably arranged so that, for example, the side surface 30a of each of the hexagonal pyramid light emission structures 30 may be in [11-20] direction, and the side edge may be in [1-100] direction. That is, with respect to a specific window, another adjacent window is disposed in a location predicted as [11-20] crystal growth direction of the specific window. The crystal growth direction may be predicted from the crystal surface being grown.

As described above, when the side surfaces 30a of the adjacent hexagonal pyramid light emission structures 30 face each other, the light emission area can be maximized. Also, the area occupied by the hexagonal pyramid light emission structures 30 may be maximized in order to increase the light emission area in such an arrangement of the windows W. The hexagonal pyramid light emission structures 30 may be formed in a large size so that a distance X between the adjacent hexagonal pyramid light emission structures 30 is 0.3 times less than an interval between the centers of the window areas of the adjacent hexagonal pyramid light emission structures 30. This allows effective increase of the light emission area, based on the window arrangement structure according to the present invention.

The area occupied by the plurality of hexagonal pyramid light emission structures 30 as described above may be designed so that a substantial light emission area, i.e., a total area of the side surfaces 30a of the hexagonal pyramid light emission structures, is larger than a total area of the dielectric layer 34. This condition can be derived from a side surface utilization ratio, based on a cosine value of an inclination angle of the hexagonal pyramid light emission structure.

Figure 4:
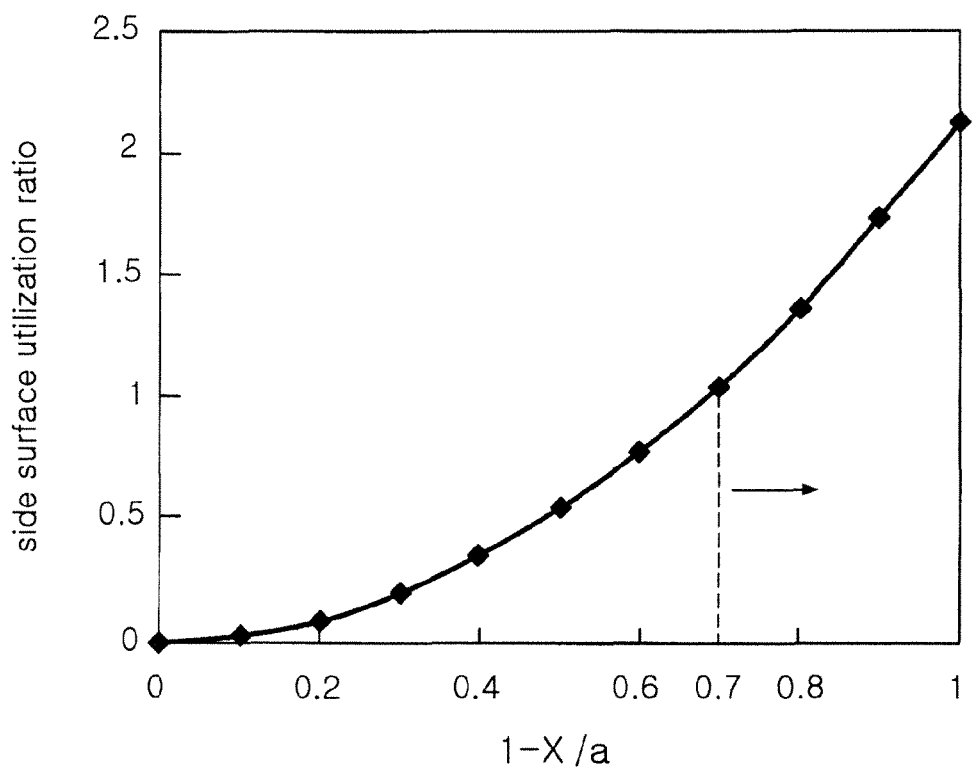
FIG. 4 is a graph showing the side surface utilization ratio according to the spatial relationship of the hexagonal pyramid structures.

FIG. 4 shows the side surface utilization ratio, i.e., the ratio of an interval a between the centers of the adjacent windows to a distance X between the side surfaces, at 62°, which is the inclination angle of the side surface 30a of the hexagonal pyramid light emission structure for optimization of piezoelectric effect. In this case, "the side surface utilization ratio" designates a ratio of a total sum of the side surface areas of all of the hexagonal pyramid light emission structures to an entire substrate (dielectric layer) area. The utilization ratio of 1 indicates that the total sum of the side surface areas is equal to the entire substrate (dielectric layer) area, and the utilization ratio greater than 1 indicates that the light emission area is substantially greater than the substrate (dielectric layer) area.

In the graph of FIG. 4, it can be seen that when a distance between the side surfaces is 0.3 with respect to an interval between the centers of the windows, the substantial light emission area (i.e., the sum of the side surfaces of the light emission structures) is almost equal to the area of the substrate (dielectric layer). On the other hand, when the distance is less than 0.3, the substantial light emission area is larger than the area of the substrate (dielectric layer). Therefore, as described hereinabove, even if the windows are disposed in an equilateral triangular arrangement where the side surfaces of the adjacent light emission structures face each other, the light emission structures are required to be grown such that the distance between the side surfaces is less than 0.3 times the interval between the centers of the windows, in order to increase the substantial light emission area. This may be translated to a condition in which, the sum of the side surface areas of the plurality of hexagonal pyramid light emission structures is greater than the total growth area of the dielectric layer.

Figure 5:
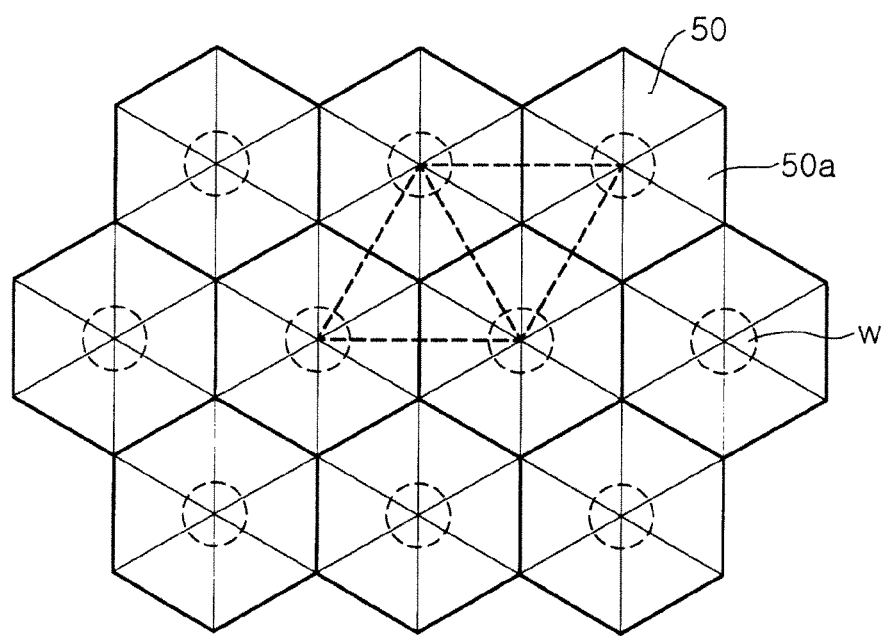
FIG. 5 is a schematic view illustrating a hexagonal pyramid nitride light emitting device array according to an embodiment of the present invention.

Therefore, the light emitting device array shown in FIG. 5 ensures a maximum light emission area in an optimal window W arrangement condition. Each of the plurality of hexagonal pyramid light emission structures 50 may be grown in a large size so that the side surfaces 50a face each other and the bases abut each other, thereby ensuring a light emission area more than two times an area of the substrate (dielectric layer).

Figure 6:
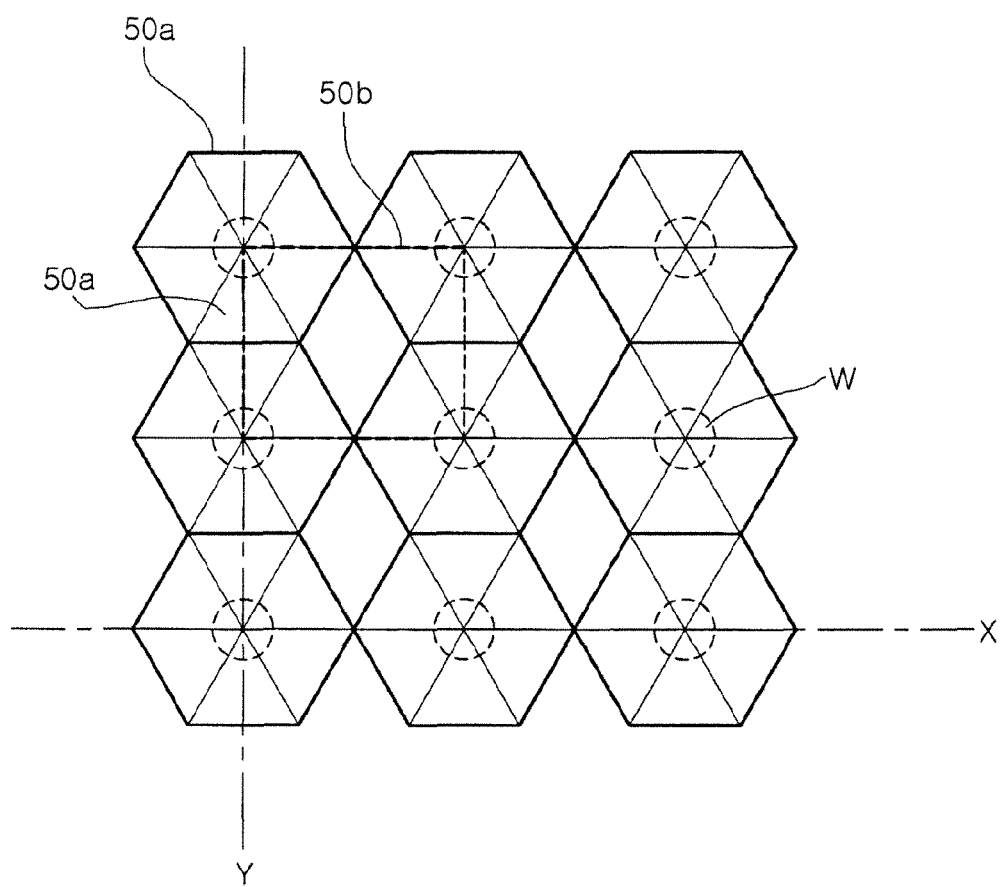
FIG. 6 is a schematic view illustrating a hexagonal pyramid nitride light emitting device array according to another embodiment of the present invention.

In an alternative embodiment, the light emission structures may be arranged with a high side surface utilization ratio by employing the window arrangement shown in FIG. 6.

As shown in FIG. 6, a plurality of windows W are formed in the dielectric layer at a predetermined interval in rows X and columns Y. In addition, the plurality of hexagonal pyramid light emission structures 50 are arranged such that the side surfaces 50a of the adjacent light emission structures face each other in one direction of rows X and columns Y, while at the same time, the edges 50b of the adjacent light emission structures abut each other in the other direction of rows X and columns Y.

Under this configuration, each of the light emission structures are grown in a large size so that the lower ends of the side surfaces across from each other may abut each other, thereby maximizing the area efficiency. In this case, when the inclination angle of the side surface is 62°, a light emission area about 1.60 times larger than the substrate area can be obtained from the side surfaces of the hexagonal pyramids.

The method of maximizing the light emission area according to the present invention may be advantageously applied to a horizontal structure as well as a vertical structure light emitting device.

Figure 7:
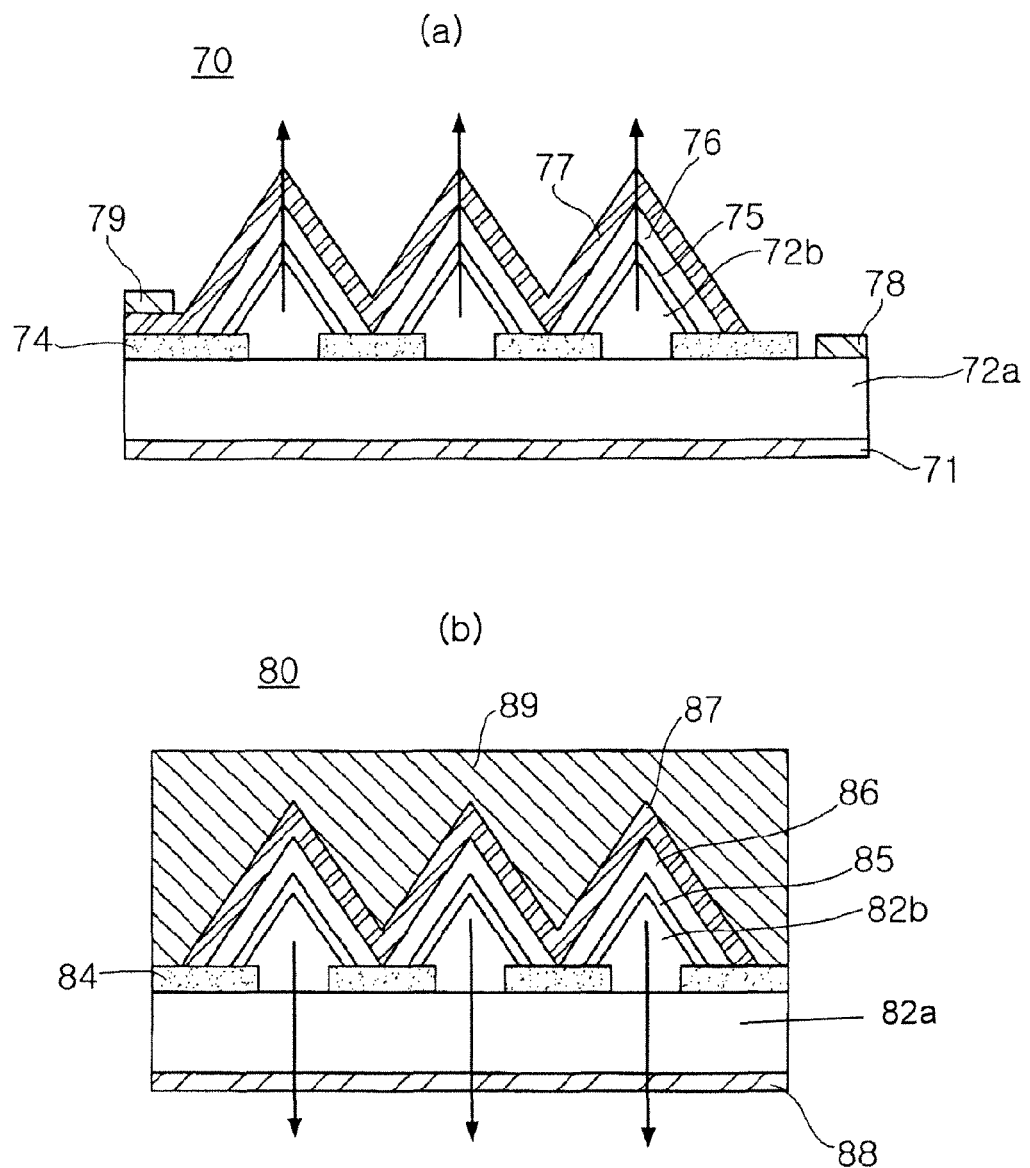
FIGS. 7(a) and 7(b) are sectional views illustrating the hexagonal pyramid nitride light emitting device according to the present invention.

FIGS. 7(a) and 7(b) are sectional views illustrating a hexagonal pyramid nitride light emitting device according to the present invention.

Referring to FIG. 7(a), a horizontal structure light emitting device 70 according to an embodiment of the present invention includes a substrate 71 with a first conductivity lower nitride semiconductor layer 72a formed thereon. In this case, the substrate may be one selected from a sapphire substrate, a SiC substrate and a Si substrate.

A dielectric layer 74 with a plurality of windows formed therethrough is formed on the first conductivity lower nitride semiconductor layer 72a. On the surfaces of the first conductivity lower nitride semiconductor layer 72a exposed by the windows, a first conductivity upper nitride semiconductor layer 72b, an active layer 75 and a second conductivity nitride semiconductor layer 76 are sequentially grown to provide a plurality of hexagonal pyramid light emission structures. The plurality of windows and the hexagonal pyramid light emission structures may be arranged as shown in FIGS. 3. 5 and 6 to maximize the effective light emission area.

As shown in FIG. 7(a), a first electrode 78 is formed on a surface of the first conductivity lower nitride semiconductor layer 72a. A light-transmitting conductive layer 77 is formed on the second conductivity nitride semiconductor layer 76, and a second electrode 79 is formed on a surface of the light-transmitting conductive layer 77.

Alternatively, FIG. 7(b) illustrates a vertical structure light emitting device according to another embodiment of the present invention.

As shown in FIG. 7(b), a dielectric layer 84 with a plurality of windows formed therethrough is formed on a first conductivity lower nitride semiconductor layer 82a. On surfaces of the first conductivity lower nitride semiconductor layer 82a exposed by the windows, a first conductivity upper nitride semiconductor layer 82b, an active layer 85 and a second conductivity nitride semiconductor layer 86 are sequentially formed to provide a plurality of hexagonal pyramid light emission structures.

In the vertical structure light emitting device array shown in FIG. 7(b), a reflective electrode 87 may be made of a metal such as Ag on the second conductivity nitride semiconductor layer 86. In addition, in order to support the remaining portion of the light emitting device when the growth substrate such as a sapphire substrate, for growing the nitride single crystal light emitting device, is removed and to provide an electrically connected structure, a conductive support structure 89 may be formed on the reflective electrode layer 87 by a metal plating method. Such a conductive support structure 89 may be formed to have a planar surface by plating with one of Ni and Cu to fill the spaces between the pyramid light emission structures. Such a conductive support structure 89 may be used as a lower electrode in a packaging process.

Next, the growth substrate such as a sapphire substrate is removed by one of laser lift-off and chemical etching. In order for uniform supply of current to the surface separated from the sapphire, a light-transmitting conductive layer 88 may be deposited thereon.

In the vertical structure light emitting device shown in FIG. 7(b), with the reflective layer formed on the hexagonal pyramid light emission structure, light is concentrated to be extracted through the first conductivity lower nitride semiconductor layer, thereby advantageously improving light extraction efficiency. This effectively enhances light efficiency due to the increased light emission area.

According to the present invention as set forth above, hexagonal pyramid light emission structures grown with very few crystal defects by selective growth are arranged to occupy a large area as possible, thereby increasing a substantial light emission area. This is applied to a vertical structure light emitting device to provide a nitride light emitting device array with high light extraction efficiency.

While the present invention has been shown and described in connection with the exemplary embodiments, it will be apparent to those skilled in the art that modifications and variations may be made without departing from the spirit and scope of the invention as defined by the appended claims.

What is claimed is:

1. A nitride semiconductor light emitting device array comprising:
    a dielectric layer formed on a first conductivity lower nitride semiconductor layer and having a plurality of windows formed therethrough;
    a plurality of hexagonal pyramid light emission structures each selectively grown from a surface of the first conductivity lower nitride semiconductor layer exposed through each of the plurality of windows and onto a peripheral area of the plurality of windows of the dielectric layer, each of the hexagonal pyramid light emission structures comprising a first conductivity upper nitride semiconductor layer, an active layer and a second conductivity nitride semiconductor layer formed in this order;
    a reflective electrode formed on the plurality of hexagonal pyramid light emission structures respectively to be contacted with the second conductivity nitride semiconductor layer; and
    a conductive support structure formed on the reflective electrode layer and filling spaces between the plurality of hexagonal pyramid light emission structures to provide a substantially planar surface,
    wherein the plurality of windows are disposed in a grid such that centers of adjacent windows are disposed in perpendicular rows and columns, and wherein a predetermined interval spacing between adjacent rows and columns is such that two opposing side surfaces of one of the plurality of hexagonal pyramid light emission structures abut side surfaces of other adjacent ones of the plurality of hexagonal pyramid light emission structures, and
    wherein a sum of side surface areas of the plurality of hexagonal pyramid light emission structures is greater than a total growth surface area of the dielectric layer.

2. The nitride semiconductor light emitting device array according to claim 1, wherein the side surface of each of the plurality of hexagonal pyramid light emission structure is in [11-20] direction.

3. The nitride semiconductor light emitting device array according to claim 1, wherein side surfaces of the hexagonal pyramid light emission structures having inclination angles of approximately 62°.

4. The nitride semiconductor light emitting device array according to claim 1, further comprising:
    a light-transmitting conductive layer formed over a surface of the first conductivity lower nitride semiconductor layer,
    wherein the surface having the light-transmitting conductive layer formed thereon is a surface opposite to a surface having the dielectric layer formed thereon, and
    wherein the light-transmitting conductive layer is formed over the surface of the first conductivity lower nitride semiconductor layer so as to provide a uniform supply of current to the nitride semiconductor light emitting device array.

5. A nitride semiconductor light emitting device array comprising:
    a dielectric layer formed on a first conductivity lower nitride semiconductor layer and having a plurality of windows formed therethrough at a predetermined interval;
    a plurality of hexagonal pyramid light emission structures each selectively grown from a surface of the first conductivity lower nitride semiconductor layer exposed by each of the plurality of windows and onto a peripheral portion of each of the plurality of windows of the dielectric layer, each of the plurality of hexagonal pyramid light emission structure comprising a first conductivity upper nitride semiconductor layer, an active layer and a second conductivity nitride semiconductor layer formed in this order;
    a reflective electrode formed on the plurality of hexagonal pyramid light emission structures respectively to be contacted with the second conductivity nitride semiconductor layer; and
    a conductive support structure formed on the reflective electrode layer and filling spaces between the plurality of hexagonal pyramid light emission structures to provide a substantially planar surface,
    wherein the windows formed through the dielectric layer are disposed in a grid such that centers of adjacent windows are disposed in perpendicular rows and columns, and wherein a predetermined interval spacing between adjacent rows and columns is such that one of the plurality of hexagonal pyramid light emission structures has at least one base abutting at least one base of at least one other adjacent hexagonal pyramid light emission structure disposed in one direction of rows and columns, and has at least one edge facing at least one edge of other adjacent ones of the plurality of hexagonal pyramid light emitting structures disposed in the other direction of rows and column, and
    wherein a sum of side surface areas of the plurality of hexagonal pyramid light emission structures is greater than a total growth surface area of the dielectric layer.

6. The nitride semiconductor light emitting device array according to claim 5, wherein side surfaces of the hexagonal pyramid light emission structures having inclination angles of approximately 62°.

7. The nitride semiconductor light emitting device array according to claim 5, further comprising:
    a light-transmitting conductive layer formed over a surface of the first conductivity lower nitride semiconductor layer,
    wherein the surface having the light-transmitting conductive layer formed thereon is a surface opposite to a surface having the dielectric layer formed thereon, and
    wherein the light-transmitting conductive layer is formed over the surface of the first conductivity lower nitride semiconductor layer so as to provide a uniform supply of current to the nitride semiconductor light emitting device array.

* * * * *